United States Patent
Lung

(10) Patent No.: US 7,463,512 B2
(45) Date of Patent: Dec. 9, 2008

(54) MEMORY ELEMENT WITH REDUCED-CURRENT PHASE CHANGE ELEMENT

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 36 days.

(21) Appl. No.: 11/769,961

(22) Filed: Jun. 28, 2007

(65) Prior Publication Data

US 2008/0192534 A1  Aug. 14, 2008

Related U.S. Application Data

(60) Provisional application No. 60/921,494, filed on Apr. 2, 2007, provisional application No. 60/888,869, filed on Feb. 8, 2007.

(51) Int. Cl.
*G11C 11/00* (2006.01)

(52) U.S. Cl. ...................................... 365/163

(58) Field of Classification Search ................. 365/163; 257/4, E45.002; 438/102
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,515,488 A | 5/1996 | Hoppe et al. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |

(Continued)

FOREIGN PATENT DOCUMENTS

| WO | WO-00/79539 | 12/2000 |
|---|---|---|
| WO | WO-01/45108 | 6/2001 |

OTHER PUBLICATIONS

Adler, David, "Amorphous-Semiconductor Devices," Sci. Amer., vol. 236, pp. 36-48, May 1977.
Adler, D. et al., "Threshold Switching in Chalgenid-Glass Thin Films," J. Appl/Phys 51(6), Jun. 1980, pp. 3289-3309.

(Continued)

*Primary Examiner*—Anh Phung
*Assistant Examiner*—Harry W Byrne
(74) *Attorney, Agent, or Firm*—Hayne Beffel & Wolfeld LLP

(57) ABSTRACT

A memory device having a reduced-thickness phase change film is described along with methods for manufacture. The device includes an electrode element, in electrical contact with a phase change layer. The latter element is formed from a memory material having at least two solid phases. A top electrode element makes electrical contact with the phase change layer at a location remote from the contact location of the electrode element. This construction produces a current flow through the phase change element in which at least a portion thereof lies in a path transverse to the current flow path within the electrode element.

21 Claims, 14 Drawing Sheets

U.S. PATENT DOCUMENTS

| | | |
|---|---|---|
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi et al. |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,126,149 B2 | 10/2006 | Iwasaki et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 2004/0051094 A1 | 3/2004 | Ooishi |
| 2005/0019975 A1* | 1/2005 | Lee et al. ............... 438/95 |
| 2005/0029502 A1* | 2/2005 | Hudgens ............... 257/4 |
| 2005/0093022 A1 | 5/2005 | Lung |
| 2005/0201182 A1 | 9/2005 | Osada et al. |
| 2005/0212024 A1 | 9/2005 | Happ |
| 2005/0215009 A1 | 9/2005 | Cho |
| 2005/0227496 A1* | 10/2005 | Park et al. ............... 438/745 |
| 2006/0108667 A1 | 5/2006 | Lung |
| 2006/0110878 A1 | 5/2006 | Lung et al. |
| 2006/0118913 A1 | 6/2006 | Yi et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |

| | | |
|---|---|---|
| 2007/0173063 A1 | 7/2007 | Lung |
| 2007/0176261 A1 | 8/2007 | Lung |
| 2007/0274121 A1 | 11/2007 | Lung et al. |

OTHER PUBLICATIONS

Ahn, S.J. et al., "A Highly Manufacturable High Density Phase Change Memory og 64 Mb and Beyond," IEEE IEDM 2004, pp. 907-910.

Axon Technologies Corporation paper: Technology Description, pp. 1-6.

Bedeschi, F. et al., "4-MB Mosfet-Selected Phase-Change Memory Experimental Chip," IEEE, 2004, 4 pp.

Blake thesis, "Investigation of GeTeSb5 Chalcogenide Films for Use as an Analog Memory, "AFIT/GE/ENG/00M-04, Mar. 2000 121 pages.

Chen, et al., "Non-Volatile Resistive Switching for Advanced Memory Applications," IEEE IEDM, Dec. 5-7, 2005, 4 pp.

Cho, S.L. et al., "Highly Scalable On-axis Confined Cell Structure for High Density PRAM beyond 256Mb," 2005 Symposium on VLSI Technology Digest of Technical Papers, pp. 96-97.

Gibson, G.A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y.H. et al., "An Edge Contact Type Cell from Phase Change RAM Featuring Very Low Power Consumtion," 2003 Symposium on VSLI Technology Digest of Technical Papers, pp. 175-176.

Happ, T.D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption, " presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-Change RAM Based on 0.24μm-CMOS Technologies," 2003 Symposium on VLSI Technology Digest of Technical Papers, pp. 173-174.

Iwasaki, Hiroko et al, "completely Erasable Phase Change Optical Disk," Jpn. J. Appl. Phys., Feb. 1992, pp. 461-465, vol. 31.

Jeong, C. W. et al., "Switching Currrent Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org <http://www.sciencenews.org>, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sanford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999.

Wicker, Guy et al., Nonvolatile, High Density, High Performance Phase Change Memory, 1999, 'http://klabs.org/richcontent/MAPLDCon99/Papers/P21_Tyson_P.
PDF#search=nonvolatile%20high%20density%20high%20performance%20phase%20change%20memory <http://klabs.org/richcontent/MAPLDCon99/Papers/P21_Tyson_P.
PDF#search='nonvolatile%20high%20density%20high%20performance%20phase%20change%20memory>', 8 pages.

Wolf, Stanley, Excerpt from: Silicon Processing for the VLSI Era-vol. 4, pp. 674-679, 2004.

Wicker, Guy, "A Comprehensive Model of Submicron Chalcogenide Switching Devices," Doctoral Dissertation, Wayne State University, Detroit, MI, 1996.

Wuttig, Matthias, "Towards a Universal Memory?" Nature Materials, Apr. 2005, pp. 265-266, vol. 4.

Yi, J. H. et al., "Novell Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

Chao, D-S. et al., "Low Programming Current Phase Change Memory Cell with Double gst Thermally Confined Structure," VLSI-TSA 2007, International symposium Apr. 23-25, 2007, 2pp.

"Thermal Conductivity of Crystalline Dielectrics" in CRC Handbook of Chemistry and Physics, Internet Version 2007, (87th edition), David R. Lide, ed. Taylor and Francis, Boced. Taylor and Francis, Boca Raton, FL.

Schrafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

"Optimized Thermal Capacitance in a Phase Change Memory Cell Design," IPCOM000141986, IP.com Prior Art Database, Oct. 18, 2006, 4 pp.

* cited by examiner

MEMORY ELEMENT WITH REDUCED-CURRENT PHASE CHANGE ELEMENT

CROSS-REFERENCE TO RELATED APPLICATIONS

This application claims the benefit of U.S. Provisional patent application No. 60/921,494 entitled "Memory Element with Reduced-Current Phase Change Element" filed on 2 Apr. 2007, which is incorporated by reference herein.

This application claims the benefit of U.S. provisional patent application No. 60/888,869 entitled "Memory Element with Reduced-Current Phase Change Element" filed on 9 Feb. 2007, which is incorporated by reference herein.

PARTIES TO A JOINT RESEARCH AGREEMENT

International Business Machines Corporation, a New York corporation; Macronix International Corporation, Ltd., a Taiwan corporation; and Infineon Technologies AG, a German corporation, are parties to a Joint Research Agreement.

BACKGROUND OF THE INVENTION

1. Field of the Invention

The present invention relates to non-volatile memory, and most specifically to memory elements incorporating a material having two or more solid phases.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very thin film thicknesses, and with variations in processes that meet the tight specifications needed for large-scale memory devices. It is desirable therefore to provide a memory cell structure having thin film dimensions and low reset currents, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY

An important aspect of the invention is a memory device having a reduced-thickness phase change film. The device includes an electrode element, in electrical contact with a phase change layer. The phase change layer is formed from a memory material having at least two solid phases. A top electrode element makes electrical contact with the phase change layer at a location remote from the contact location of the electrode element. This construction produces a current flow through the phase change layer in which at least a portion thereof lies in a path transverse to the current flow path within the electrode element. In some embodiments a block element, formed of an insulating material, lies on the opposite side of the phase change layer from the electrode element, having a lateral extent in the direction of the phase change layer greater than that of contact area between the phase change layer and the electrode element.

A further aspect of the invention is a memory device having a thin film phase change element. A film thickness in the range 2-20 nm permits a very low reset current and allows for very low usage of memory material.

Another aspect of the invention is the use of an insulating block element opposite the electrode element and in contact with the memory material, and a bit line overlying and surrounding the block element to contact the phase change layer near the perimeter of the block element. The block element preferably has a lateral extent in the direction of the phase change layer greater than that the electrode element, and forces current flow through the memory material, ensuring sufficient Joule heating to produce the desired phase change.

DETAILED DESCRIPTION

A detailed description of thin film phase change memory cells, arrays of such memory cells, and methods for manufacturing such memory cells, is provided with reference to FIGS. 1-14. It will be understood that the descriptions and drawings herein are intended as exemplary material, and shall not be understood to limit the scope of the invention. The claims following this description shall be the sole determinant of the scope of the invention.

Figure 1:
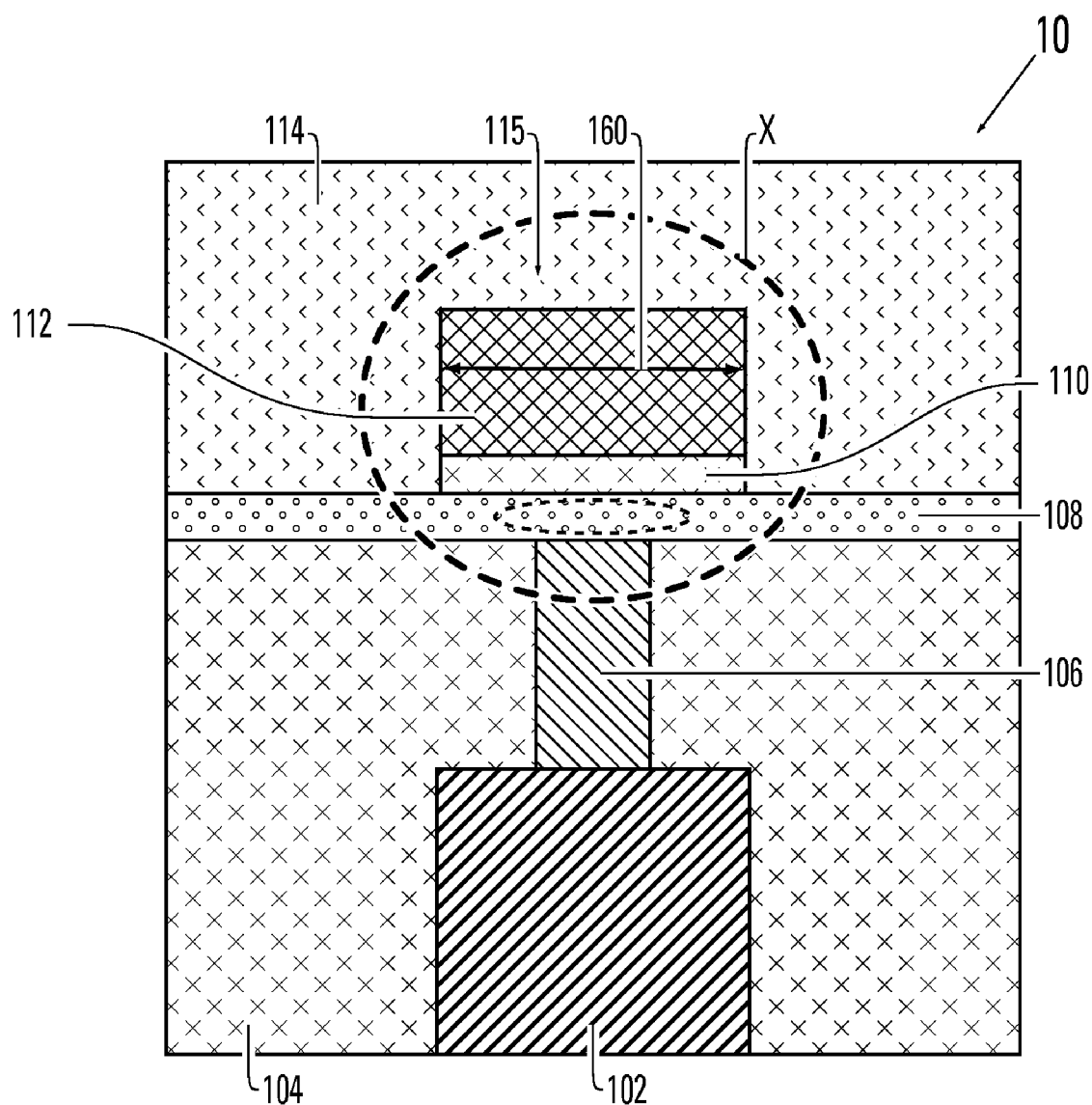
FIG. 1 illustrates a memory element in accordance with an embodiment.

A memory element 10 in accordance with an embodiment is shown in FIG. 1. It will be understood that FIG. 1 presents, in schematic form, only a portion of a memory chip as finally fabricated and placed in use. Circuit elements are formed both above and below the portion shown here. In one embodiment, for example, a transistor lies below the memory element, as explained below.

It is useful to pause at this point to clarify several matters of terminology. First, it should be noted that the term "memory element" refers to the devices required to provide a location for storing one or more bits of information. A "memory cell" is a combination of a memory element and an element of an access circuit which conventionally consists of a transistor having a gate coupled to a word line, a drain coupled to a contact for connection to the memory element, and a source coupled to a reference line or ground, or consists of a diode having one terminal coupled to a word line or a reference line. The access circuits operate in conjunction with parallel arrays of bit lines and word lines to route signals to appropriate individual memory elements. Other structures may be used for providing access to memory elements, as may be selected by those skilled in the art. Here, the access circuits are preferably located at a level below that of memory element 10, and they are not shown.

At the base of the memory element 10, a contact element 102 having a top surface conducts current from circuit elements lying below the elements shown in FIG. 1. The contact element 102 is preferably formed from a refractory metal such as tungsten (W). Other suitable refractory metals include Ti, Mo, Al, Ta, Cu, Pt, Ir, La, Ni, and Ru, as well as oxides and nitrides of such materials. For example, materials such as TiN, RuO or NiO are known and effective refractory metals. The contact element 102 functions as a current path to an electrode element 106.

The electrode element 106 is preferably formed from a material that is effective as a current carrier while at the same time offering limited reactivity with phase change materials (discussed below). One embodiment employs TiN in this role. Alternatively, TaN can be employed, and in other embodiments the electrodes may be TiAlN or TaAlN.

Contact element 102 and electrode element 106 are surrounded by dielectric fill layer 104, which is preferably a dielectric fill material such as silicon dioxide. Other suitable materials include polyimide, silicon nitride or other dielectric fill materials known in the art.

Above the electrode element 106 and in electrical contact with a top surface of the electrode element 106 lies a thin film layer of phase change material 108. The phase change material layer 108 can be fabricated from a number of different materials, including chalcogenides. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2 Sb_2 Te_5$, $GeSb_2 Te_4$ and $GeSb_4 Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

Other programmable resistive memory materials may be used in other embodiments of the invention, including $N_2$ doped GST, $Ge_xSb_y$, or other material that uses different crystal phase changes to determine resistance; $Pr_xCa_yMnO_3$PrSrMnO, $ZrO_x$, or other material that uses an electrical pulse to change the resistance state; 7,7,8,8-tetra-cyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr 100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post deposition treatment condition. A collimator with an aspect ratio of 1~5 can be used to improve the fill-in performance. To improve the fill-in performance, the DC bias of several tens of volts to several hundreds of volts is also used. On the other hand, the combination of DC bias and the collimator can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO (YBaCuO3, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; ZnxOy; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr 100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimator with an aspect ratio of 1~5 can be used to improve the fill-in performance. To improve the fill-in performance, the DC bias of several tens of volts to several hundreds of volts is also used. If desired, the combination of DC bias and the collimator can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of Ar/$O_2$, Ar/$N_2$/$O_2$, pure $O_2$, He/$O_2$, He/$N_2$/$O_2$ etc. at the pressure of 1 mTorr 100 mTorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several tens of volts to several hundreds of volts is also used. If desired, the combination of DC bias and the collimator can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or Ar/$O_2$ mixed gas or Ar/$N_2$/$O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM- TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 Torr to 10-10 Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer held (typically at room temperature or temperature less than 200° C.) for a time sufficient for solid-state formation. The hold time ranges from several minutes to days, depending on the temperature and on the formation conditions.

As will be appreciated, those in the art are able to apply the principles set out herein to select and appropriate phase change element to fit particular circumstances. Given the improvements contained in the claimed invention, the phase change element can be extremely thin, for example in a range from 2-20 nm.

Atop the phase change material layer 108, and generally centered on the electrode element 106 is a two-layer structure consisting of a separator layer 110 and a shield layer 112. Preferably, the separator layer 110 is considerably thinner than is the shield layer 112. The separator layer 110 is composed of an electrical and thermal insulating material, such as $SiO_2$ or similar material.

If desired, a more effective thermal insulating material than the separator layer 110 can be employed for the shield layer 112. Such a thermal insulator material should be a better thermal insulator than the material of separator layer 110, preferably at least 10% better. Therefore, when the separator layer 110 comprises silicon dioxide, the thermal insulator material of the shield layer 112 preferably has a thermal conductivity value "kappa" of less than that of silicon dioxide which is 0.014 J/cm*K*sec. In other preferred embodiments, the thermal insulator material of the shield layer 112 has a thermal conductivity less than that of the amorphous state of the phase change material, or less than about 0.003 J/cm*K*sec for a phase change material comprising GST. Representative materials for separator layer 110 include low permittivity (low-K) materials, including materials that are a combination of the elements silicon Si, carbon C, oxygen O, fluorine F, and hydrogen H. Examples of thermally insulating materials which are candidates for use as separator layer 110 include SiCOH, polyimide, polyamide, and fluorocarbon polymers. Other examples of materials which are candidates for use for separator layer 110 include fluorinated Si $O_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. A single layer or combination of layers can provide thermal insulation.

To protect the separator layer 110 the shield layer 112 is provided, preferably completely covering the separator layer 110. $SiO_2$ and similar materials are vulnerable to reaction with materials generally employed for metallization layers, and thus it is advantageous to provide a protective material to block such interactions. It is preferred to employ SiN or similar material for the shield layer 112.

Together, the separator layer 110 and the shield layer 112 form a block 115. Because it is an insulator and has a lateral extent (length 160) in the direction of the phase change material layer 108 greater than that of the electrode element 106, the block 115 prevents current from flowing directly across the phase change material layer 108 to the top electrode element 114 (which in some embodiments is a portion of a bit line 114). Rather the current is channeled around the block 115. Thus, the current path through the phase change layer 108 is directly controlled by the length 160 of the block 115 parallel to the phase change material layer 108. The effect of this feature will be seen more clearly in connection with FIG. 2.

The top electrode element 114 contacts the portion of the phase change material layer 108 not covered by the block 115, providing a current path from the top electrode element 114 through the phase change material layer 108 to the top surface of the electrode element 106. In one embodiment the top electrode element 114 is formed preferably from titanium nitride, but other embodiments employ other conventional metallizing material. Other types of electrode materials include tantalum nitride, aluminum, copper or tungsten based materials can be used in other embodiments. Also, non-metal conductive material such as doped polysilicon can be used. If it is desired to employ Cu for this layer, precautions should be taken to prevent harmful interactions between that layer and other materials in the structure.

Figure 2:
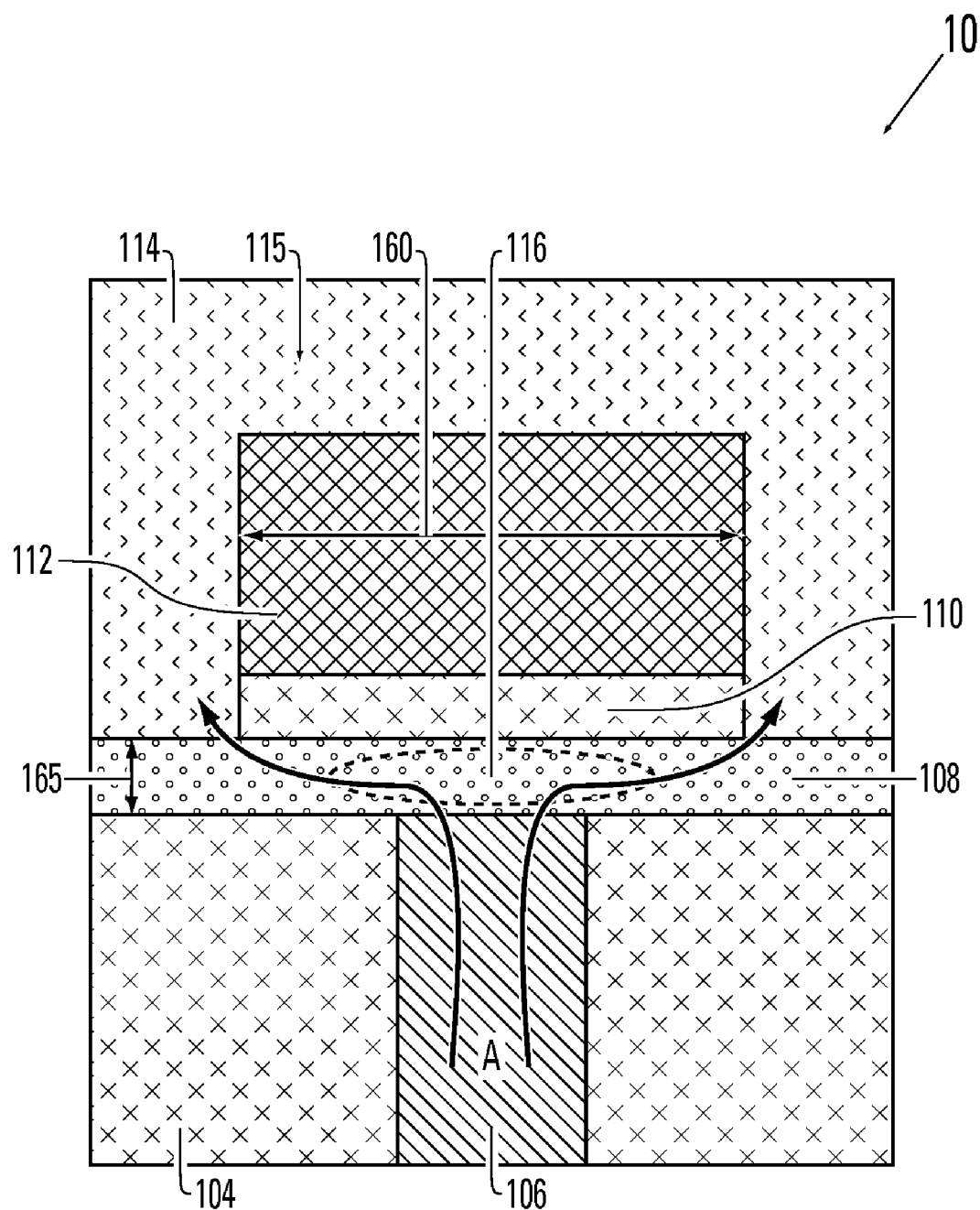
FIG. 2 depicts current flow within the embodiment of FIG. 1.

Current flow within the memory element is shown in FIG. 2, which depicts actions within area X of FIG. 1. As seen there, current flows from the contact element (see FIG. 1, ref. no. 102) through the electrode element 106, as shown by arrows A. In order to reach top electrode element 114, the current is restricted to the relatively confined area of phase change material layer 108 underlying the separator layer 110, thus establishing a small active region within the phase change material layer 108 represented by the dashed line 116. It can be seen that the size of the active region 116 is determined by the length 160 of the block 115, together with the thickness 165 of the phase change material layer 108 and the area of the top surface of the electrode element 106. Having a small active region 116 serves to reduce the power required for inducing phase change in the phase change material layer 108. The length 160 of the block 115 serves to extend the current path within the phase change material layer 108, and provide thermal isolation of the active region 116 from the top electrode element 114, which serves to further reduce the current required for inducing phase change. Current flowing through the phase change material layer 108 produces Joule heating in active region 116, which in turn causes changes in the phase change material in the active region 116.

It is important to note that the current flow path in this embodiment differs from that seen in conventional devices. Normally, current flowing from a first electrode, such as electrode element 106, to a second electrode, such as top electrode element 114, passes through an intervening device, such as phase change material layer 108, in a straight line, thus moving through the phase change layer 108 in the shortest possible path. The shortness of that path can be a problem, however, if the flow is not sufficient to produce sufficient Joule heating to cause a phase change. Also, if the path is too short, the amorphous layer formed during a reset operation will be thin. If the amorphous layer is too thin, it may not have a sufficiently high resistance, and it may breakdown under relatively low operating voltages. In the illustrated embodiment, that difficulty is surmounted by increasing the current path length without increasing the thickness of the phase change material layer 108 by causing the current path to change direction and flow for some period within the phase change material layer 108 instead of only through it. The embodiment shown in FIGS. 1 and 2 accomplishes that result by imposing a block 115 in the current path, so that the current flowing as shown by arrows A takes an outward turn transverse to the current path within the electrode element 106 until the perimeter of the block 115, where it can then flow into the top electrode element 114. Other embodiments could employ other structural features to accomplish that result.

The electrode structure resulting from formation of contact to the phase change layer 108 near the perimeter of the block 115, as shown using the top electrode element material in this example, and that produces the desired current flow path, such as that shown in FIG. 2, can be termed a "side electrode" based on the fact that the top electrode element 114 does not make contact with the phase change material layer 108 in the area directly opposite the electrode element 106, but rather the contact area is offset laterally from that of the electrode element 106.

Figure 3A:
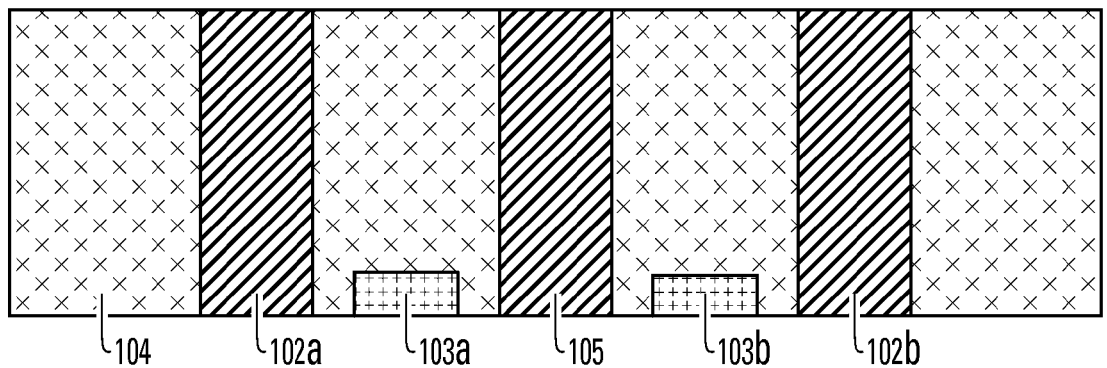
FIGS. 3A-3N illustrate an embodiment of a process of fabricating the element of FIG. 1.
Figure 3B:
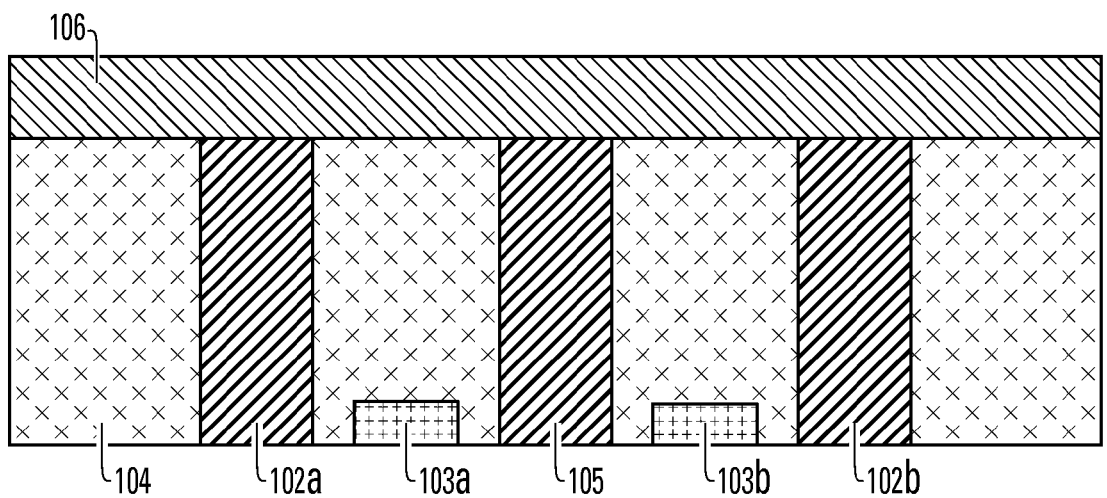
Figure 3C:
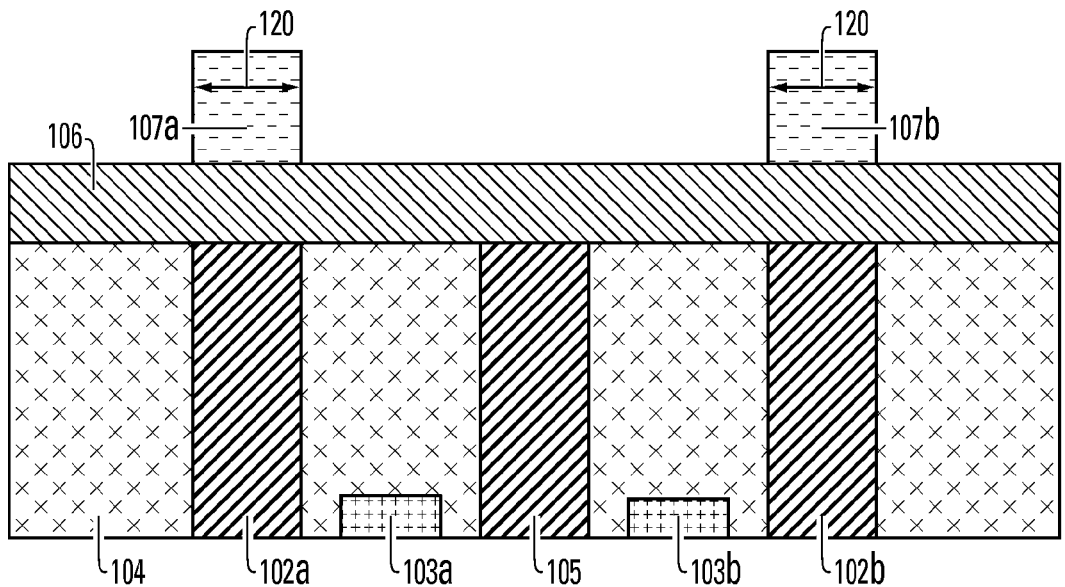
Figure 3D:
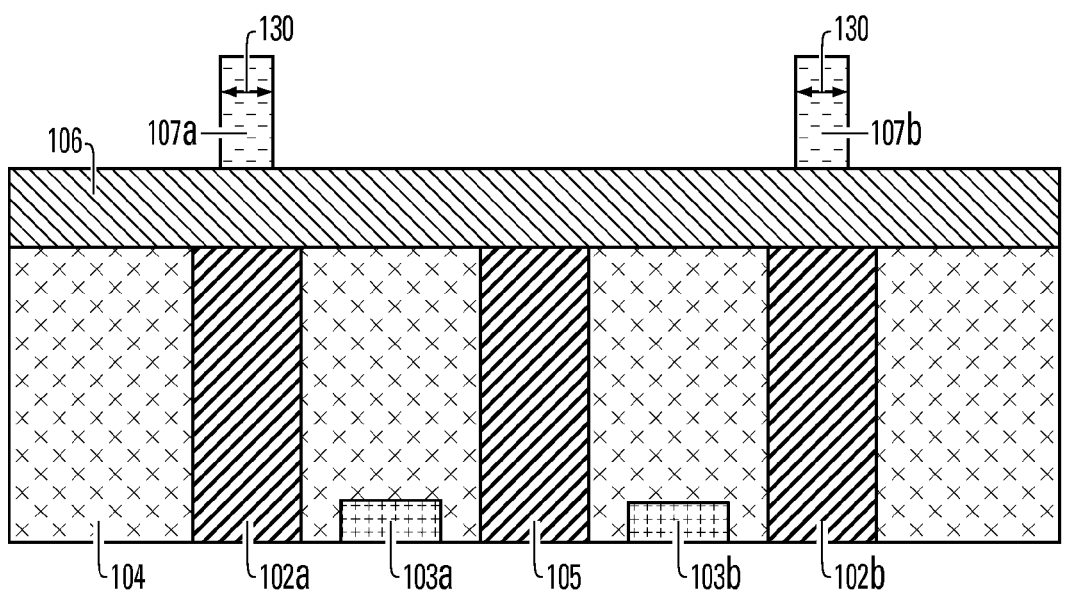
Figure 3E:
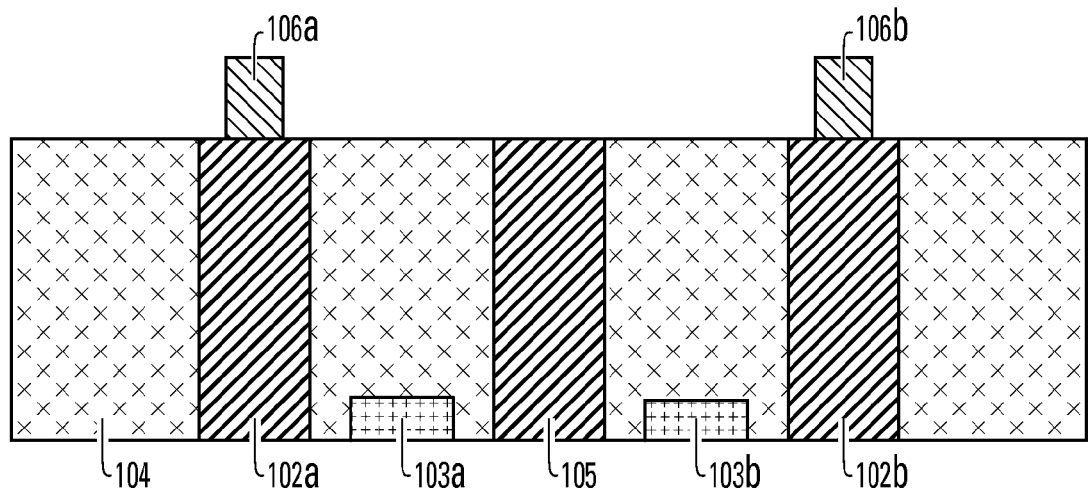
Figure 3F:
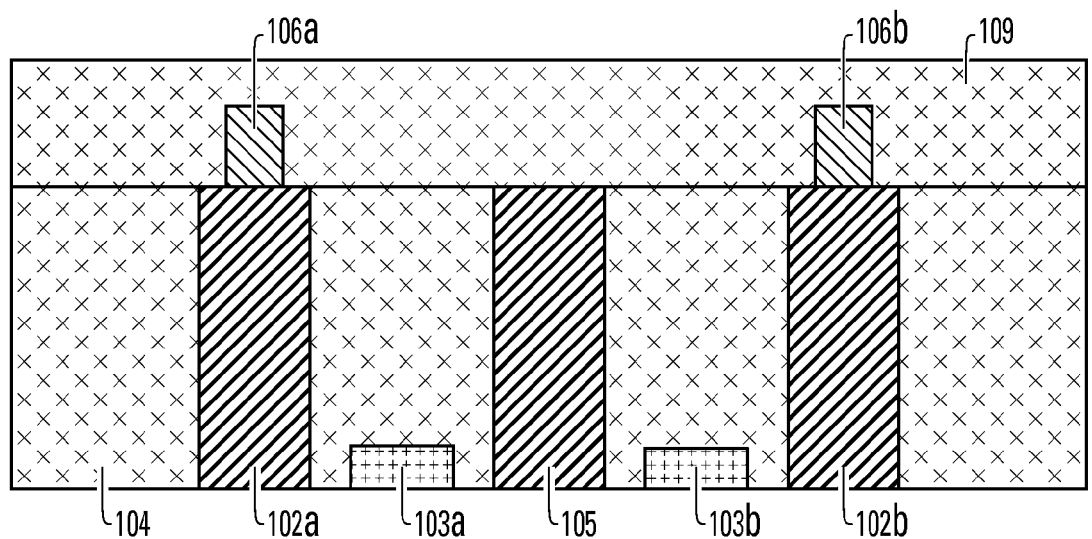
Figure 3G:
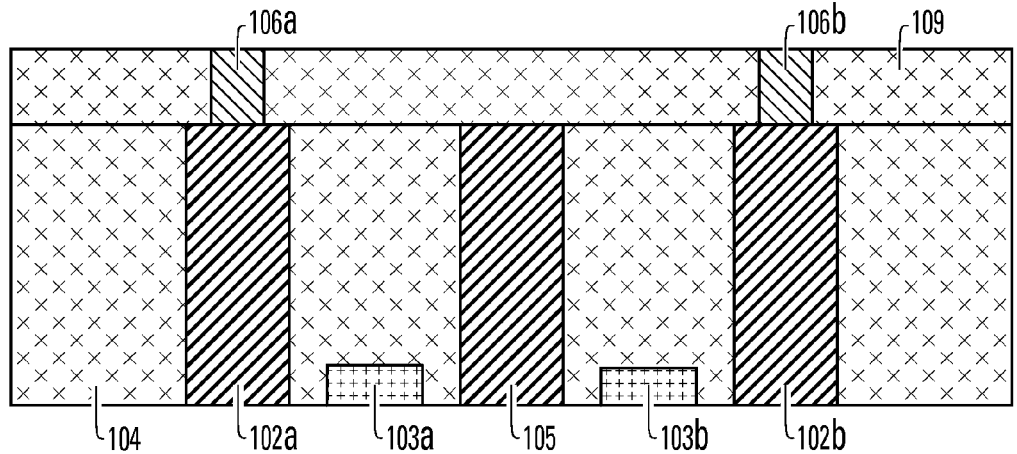
Figure 3H:
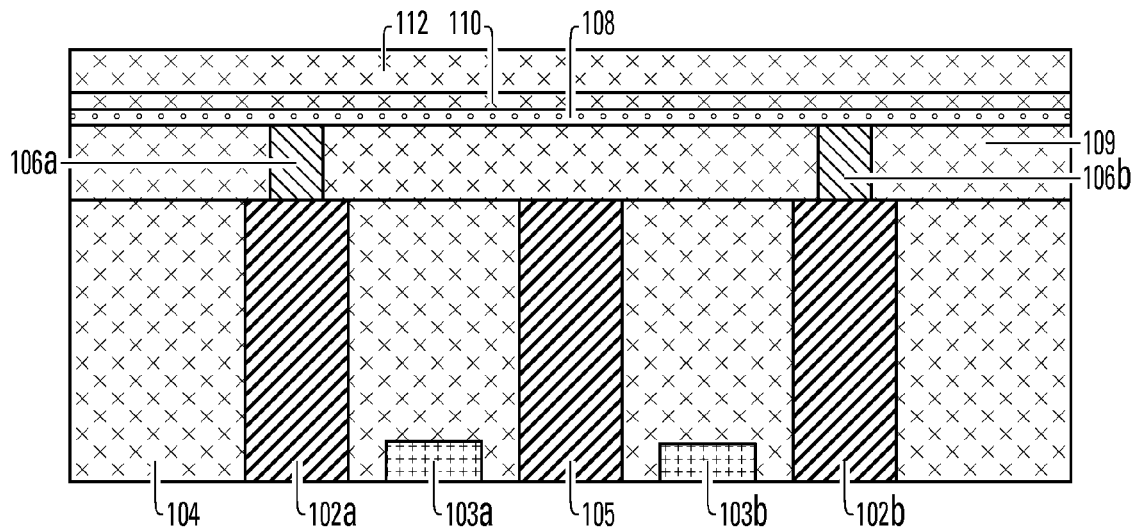
Figure 3I:
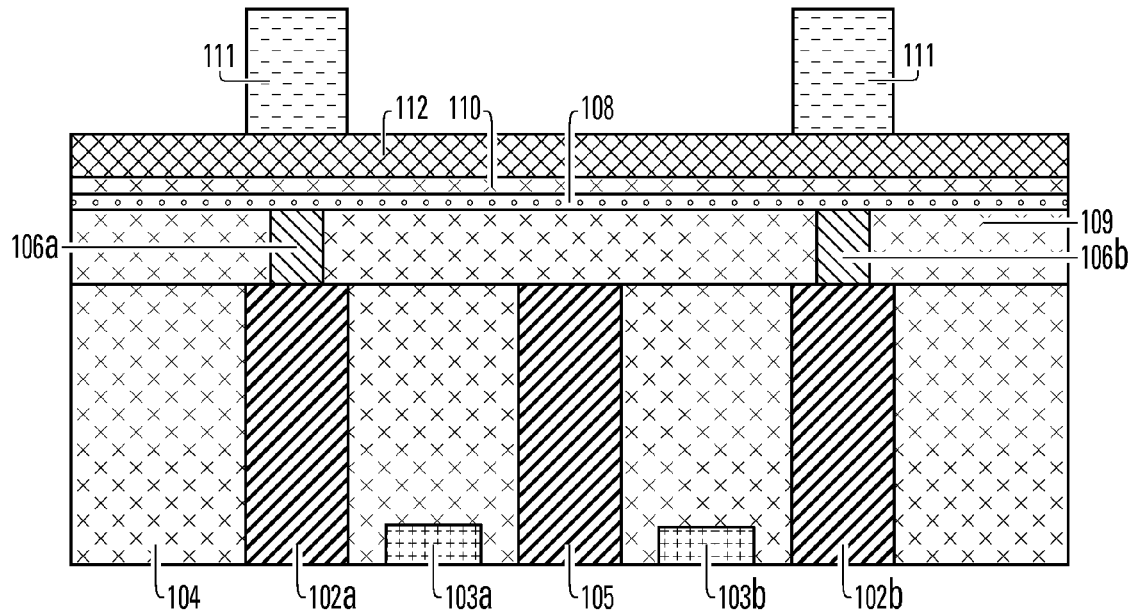
Figure 3J:
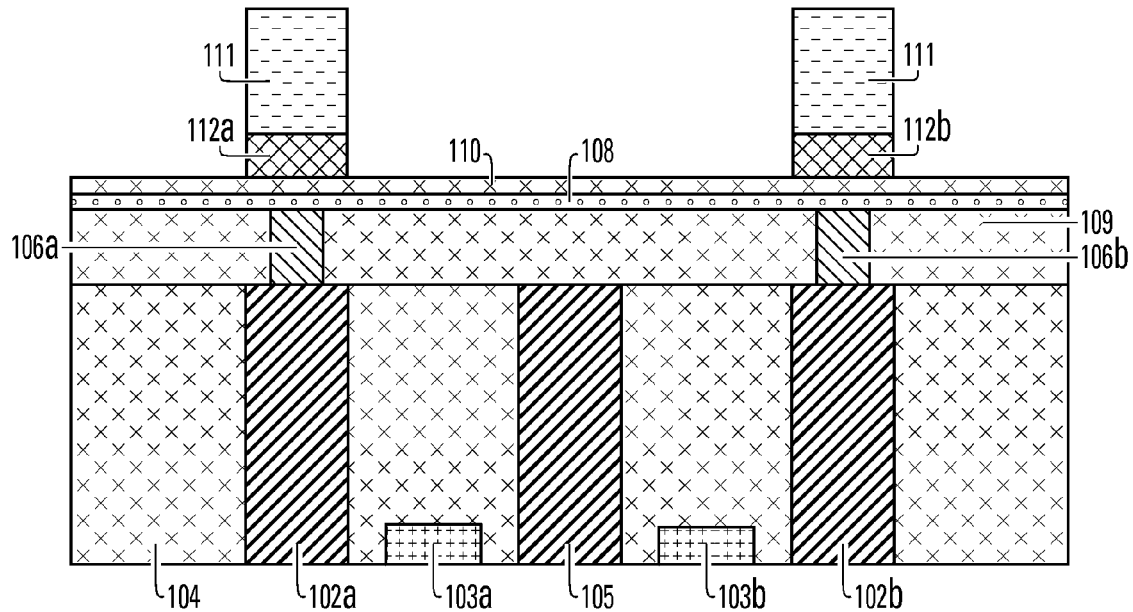
Figure 3K:
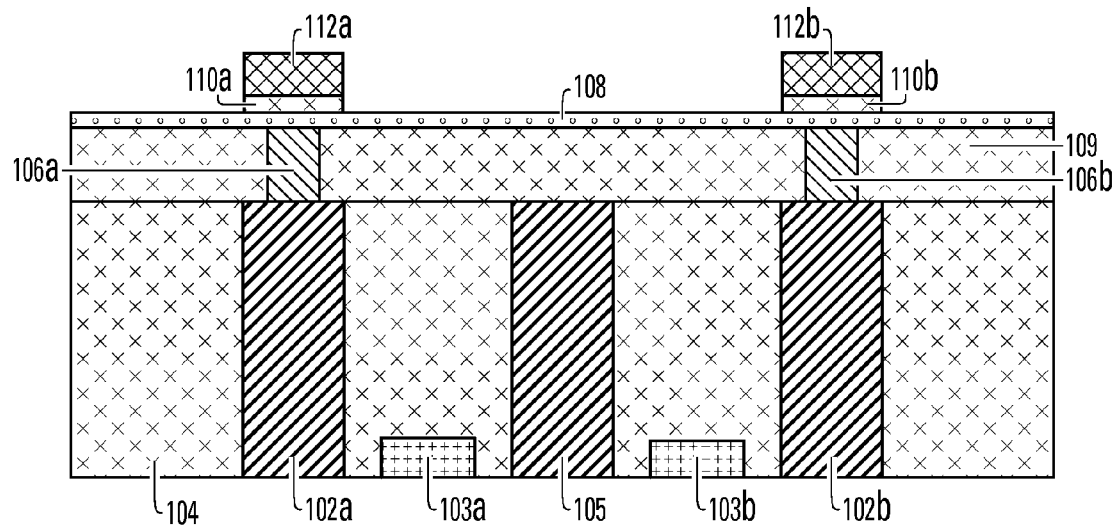
Figure 3L:
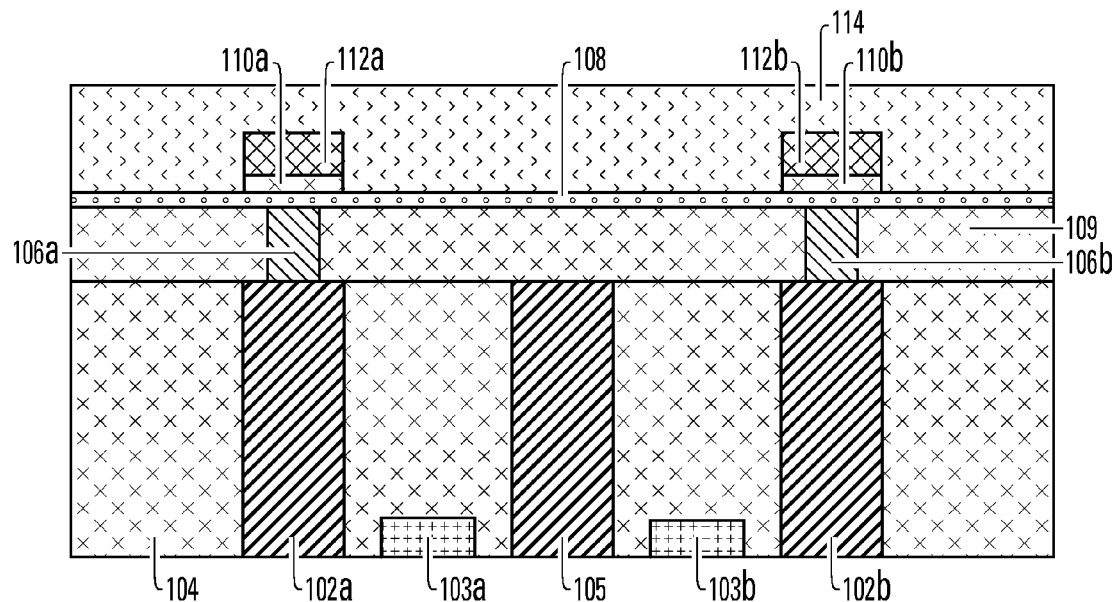
Figure 3M:
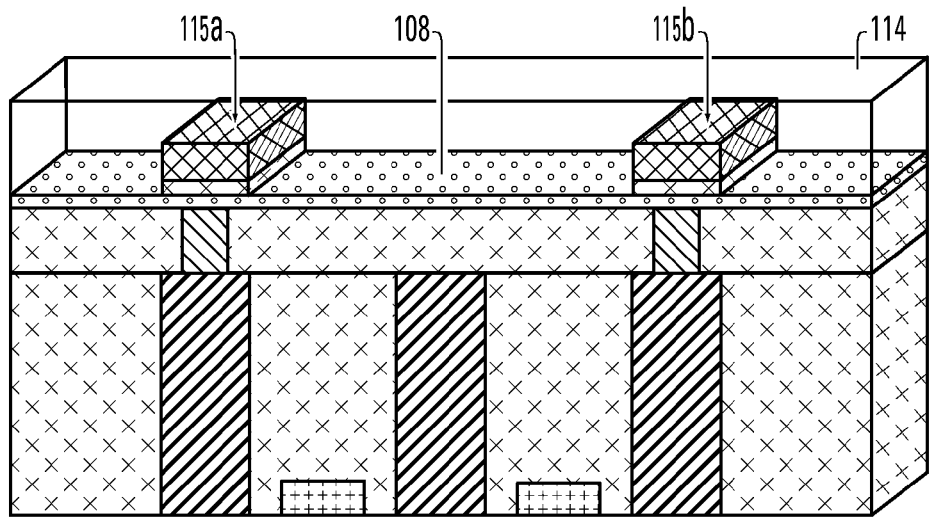
Figure 3N:
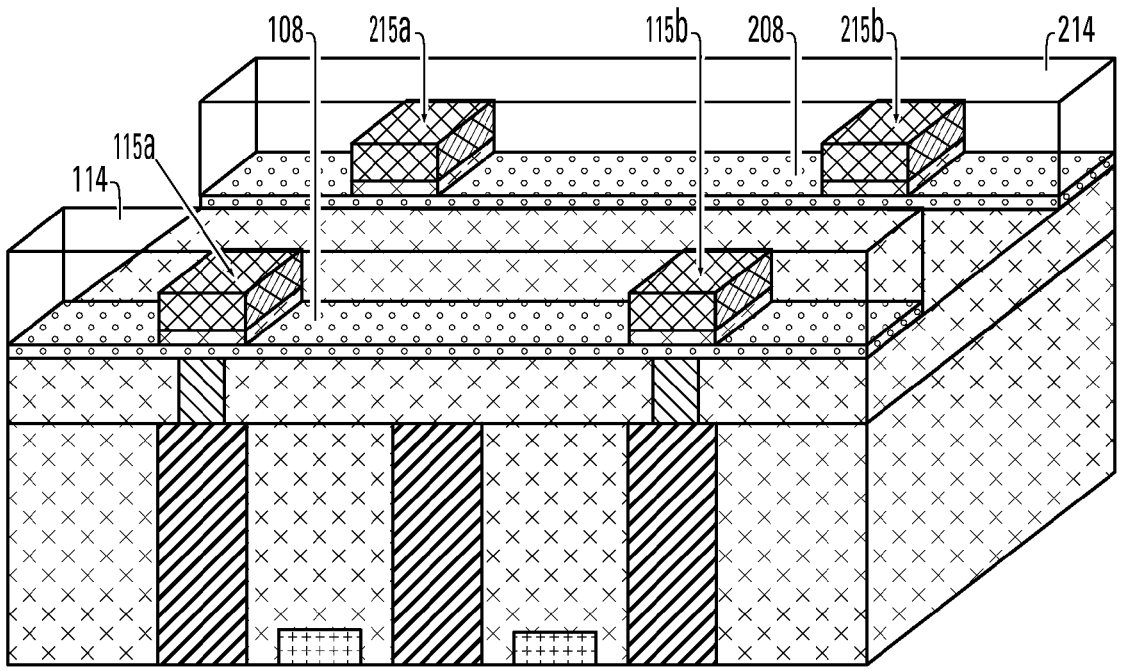

An embodiment of a process for fabricating the memory device of the present invention is shown in FIGS. 3A-3N. As noted above, a memory array is preferably formed employing pairs of memory cells, which structure is shown here. The process begins with a base structure as seen in FIG. 3A, which illustrates a structure suitable for the formation of multiple memory cells, as will be shown below. Contact elements 102a and 102b extend through the dielectric fill material 104, each serving a separate memory element. Materials for these two elements 102a, 102b are described above. Word lines 103a, 103b extend in a direction perpendicular to the plane of the cross-section illustrated in FIG. 3a, connecting a number of memory elements in a manner known in the art. In preferred embodiments the word lines 103 comprise polysilicon. Other embodiments could employ other conductive material as is known in the art. Common source line 105 extends through the middle of the pair of memory elements, parallel to the word lines 103a, 103b. Dielectric fill material 104 surrounds these elements, as discussed above. Fabrication to this point proceeds as is known in the art, concluding with a planarizing step such as a chemical-mechanical polishing (CMP) step that leaves an essentially flat surface atop the base portion.

Next, as shown in FIG. 3B, a layer of conducting material 106 is deposited atop the base portion.

FIGS. 3C and 3D depict the deposition and trimming of photoresist patches 107a and 107b, both formed from photoresist material as known in the art. Here, however, conventional lithographic processing is not sufficient to achieve the small dimensions required, in that the preferred width of the phase change region and electrode elements formed in subsequent steps are less than the minimum feature size achievable by conventional lithography. Thus, the photoresist is preferably patterned to the smallest possible size 120 in the step shown in FIG. 3C, followed by a trimming step in FIG. 3D to produce the patches 107a and 107b having the required size 130. The process for achieving this result is disclosed in pending patent applications owned by the assignee hereof, such as U.S. patent application Ser. No. 11/338,285, entitled "Self-Aligned Manufacturing Method, and Manufacturing Method For Thin Film Fuse Phase Change Ram," filed Jan. 24, 2006, which document is incorporated by reference herein.

By anisotropic etching using the resulting photoresist patches 107a, 107b as a mask, pillar-shaped electrode elements 106a, 106b are formed, and then the photoresist patches 107a, 107b stripped, resulting in the structure shown in FIG. 3E. Next an upper insulation layer 109 is deposited, the upper insulation layer 109 preferably comprising material the same or similar to that of the dielectric fill layer 104, resulting in the structure illustrated in FIG. 3F. Upper insulation layer 109 is deposited such that it completely covers the electrode elements 106a, 106b, and then the upper insulation layer 109 is subjected to planarization, preferably employing chemical-mechanical polishing (CMP), to expose the electrode members 106a and 106b, resulting in the structure illustrated in FIG. 3G.

On the resulting surface, three layers of material are deposited, as depicted in FIG. 3H. First, a layer of phase change material 108 is deposited, followed by separator layer 110 and shield layer 112. Materials for these layers are discussed above. As noted above, the phase change layer is preferably very thin, for example in a range from 2-20 nm thick.

FIGS. 3I and 3J illustrate the formation of the two separate shield elements 112a and 112b, from shield layer 112. Using conventional techniques, a layer of photoresist is applied to the structure of FIG. 3H, and the photoresist is patterned to the desired dimensions, producing photoresist patches 111. Then, as depicted in FIG. 3J, the shield elements 112a, 112b are defined, preferably employing a dry anisotropic etch using a reactive ion etching (RIE). An optical emission tool may be used to identify and control the end point of the etch when the separator layer 110 is encountered.

Next, preferably using a wet etch process, the separator layer 110 is removed in all areas not overlain by the shield elements 112a and 112b, forming two separator elements 10a, 10b from the separator layer 110. Following this two-stage etching process, the photoresist patches 111 are stripped employing conventional techniques resulting in the structure illustrated in FIG. 3K.

Next bit line material is deposited to completely cover the structure of FIG. 3K, and patterned to define the bit line 114 extending perpendicular to the word lines 103a, 103b, as illustrated in FIG. 3L.

The overall structure of the memory element of the claimed invention is seen in the perspective drawings of FIGS. 3M and 3N. In the former, a single bit line 114 is shown with the material of the bit line 114 omitted for clarity, with elements as described above. The composition of this structure is discussed above, except that the separator and shield elements 110, 112 are combined into blocks 115a and 115b and the memory material layer 108 comprises a line of memory material. In the illustrated embodiment the sides of the bit line 114 are aligned with the sides of the line of memory material layer 108.

FIG. 3N depicts a second bit line 214 positioned behind the first bit line 114, with identical elements, including phase change material layer 208 comprising a second line of memory material, blocks 215a and 215b, and bit line 214. It will be understood that in a similar manner the structure of FIG. 3N can be expanded to produce an array of a billion or more memory elements.

FIGS. 4-12 illustrate a preferred alternative manufacturing method for forming the electrode element 106 to that illustrated in FIGS. 3B-3G.

Figure 4:
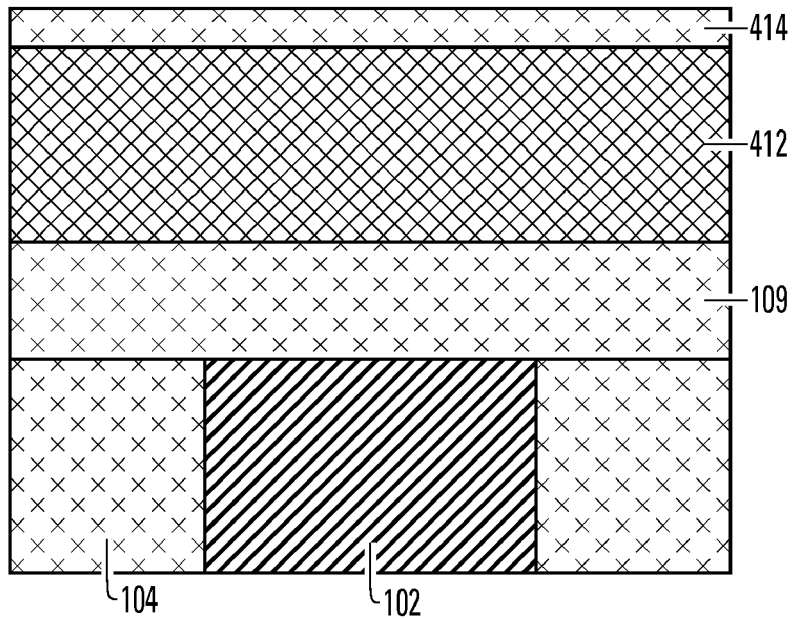
FIGS. 4-12 illustrate a preferred alternative embodiment of fabricating the electrode element.

FIG. 4 illustrates an upper insulation layer 109 deposited over the contact element 102, a second dielectric layer 412 deposited on the upper insulation layer 109, and a cap layer 414 deposited on the second dielectric layer 412.

Figure 5:
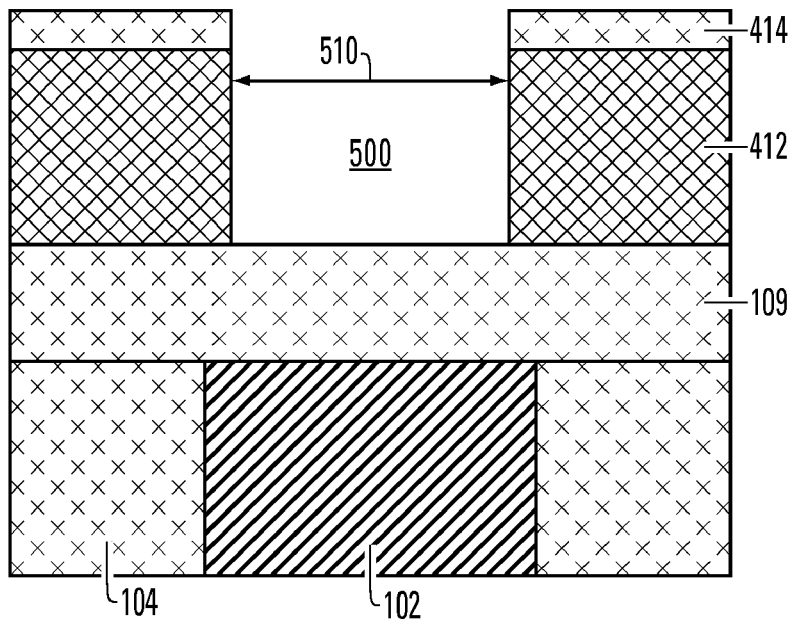

Next a via 500 having a critical dimension 510 is formed through the cap layer 414 and through the second dielectric layer 412 to the upper insulation layer 109, resulting in the structure illustrated in FIG. 5. The via 500 may be formed using an anisotropic, non-selective etch technique, such as a directional plasma etch technique, suitable for etching both the cap layer 414 and second dielectric layer 412. Several suitable directional non-selective etch techniques are known in the art. Alternatively, two etch techniques are used, such as using a first etch technique to define the via 500 through the cap layer 414, and then using a subsequent etch technique to define the via 500 through the second dielectric layer 412.

Figure 6:
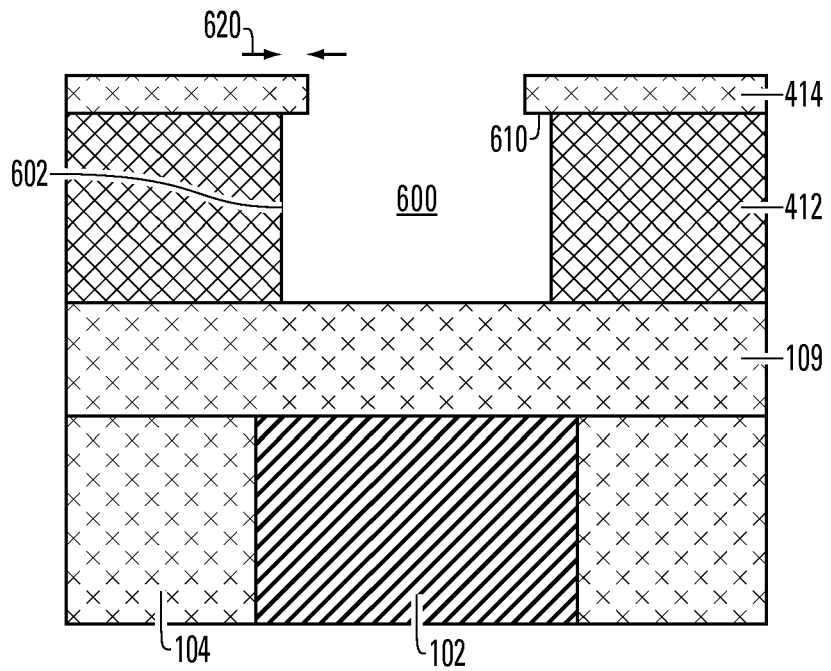

Next a second etch process is used to selectively remove ("etch back") additional second dielectric layer 412 to form an enlarged via 600 and to form overhanging portion 610 of the cap layer 414 having a critical dimension 620. In a particular embodiment, the second etch process is a selective isotropic etch that etches the second dielectric layer 412, comprising for example silicon dioxide, but does not significantly etch the cap layer 416 or upper insulation layer 109, each comprising for example silicon nitride, such as a buffered HF wet-chemical etch or a non-directional plasma etch. The enlarged via 600 has a wall 602 which in the illustrated embodiment of FIG. 6 is essentially vertical. In some alternative embodiments the wall 602 is other than vertical, including for example the wall 602 having a bowed shape.

Figure 7:
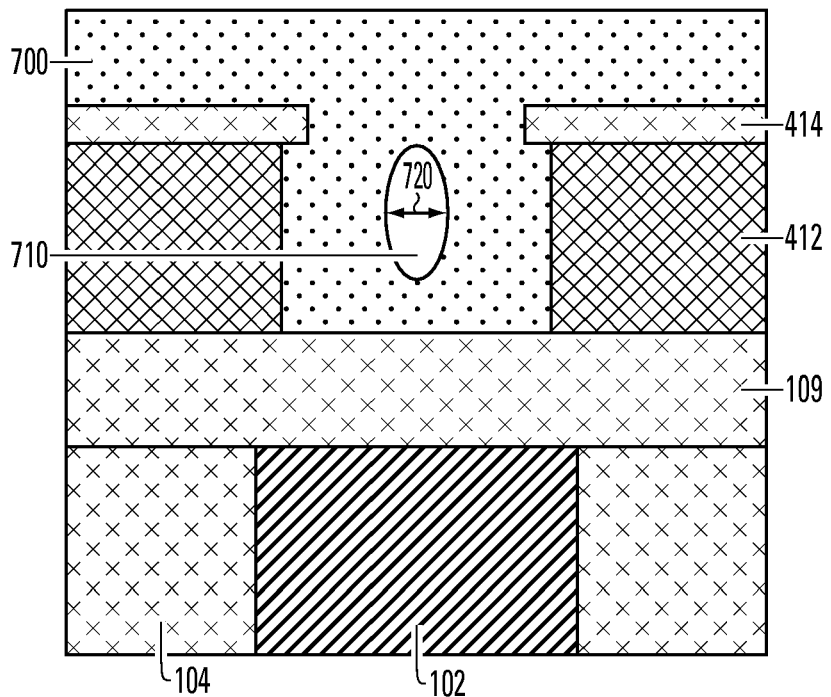

Next a sidewall spacer layer 700 is deposited on the cap layer 414 and within the enlarged via 600, resulting in the structure illustrated in FIG. 7 having a keyhole seam 710 within the enlarged via 600 and extending below the cap layer 414. The keyhole seam 710 is self-aligned to essentially the center of the enlarged via 600 and has a maximum diameter 720 of about twice the critical dimension 620 of the overhanging portion 610. The sidewall spacer layer 700 can comprise for example amorphous silicon and can be formed for example by Chemical Vapor Deposition CVD.

The overhanging portion 610 facilitates formation of the self-aligned keyhole seam 710. A greater overhang critical dimension 620 will produce a keyhole seam 710 having a larger maximum diameter 720. The overhang critical dimension 620 is very controllable, and typically a 10% variation in the overhang critical dimension 620 is on the order of one's of nanometers, thus a 10% variation in the overhang critical dimension 620 will produce a variation in the keyhole seam maximum diameter 720 of only a few nanometers. This is very desirable because it can be used to produce very uniform memory cells across a wafer containing many memory cells.

Figure 8:
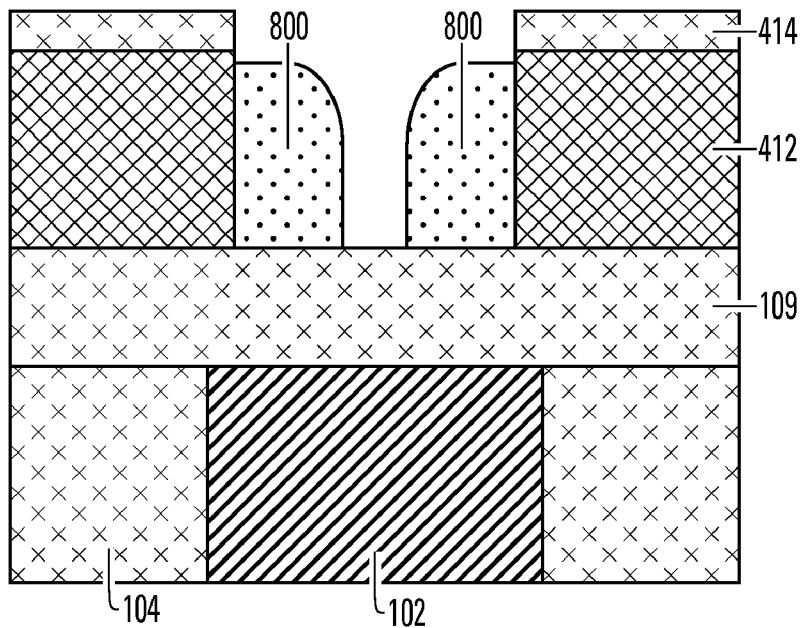

Next etching is performed on the sidewall spacer layer 700 to form sidewall spacer 800 and expose a portion of the top surface of the upper insulation layer 109, resulting in the structure illustrated in FIG. 8.

Figure 9:
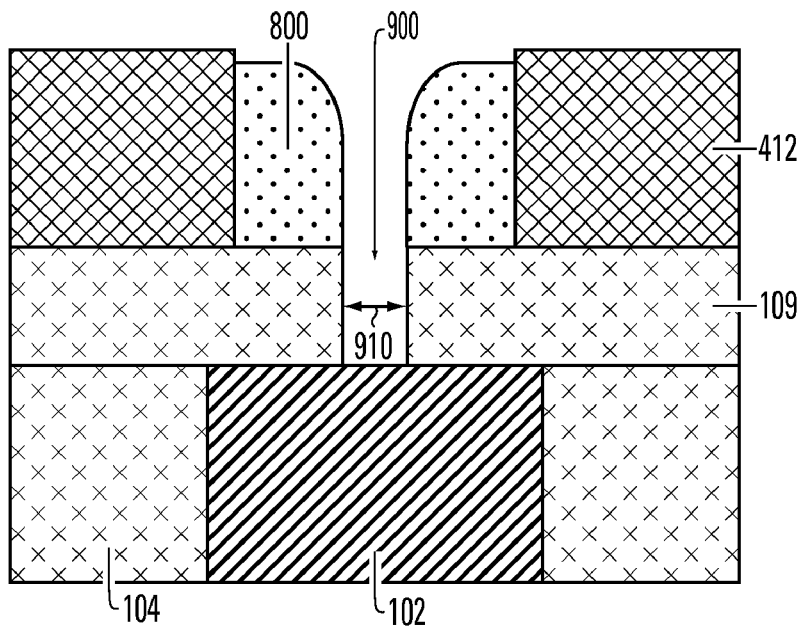

Next the upper insulation layer 109 and the cap layer 414 are etched using the sidewall spacer 800 as a mask to form a void 900 having a critical dimension 910, thereby exposing a portion of the top surface of the contact element 102 as illustrated in FIG. 9. As can be appreciated, the critical dimension 910 of the void 900 is very controllable.

Figure 10:
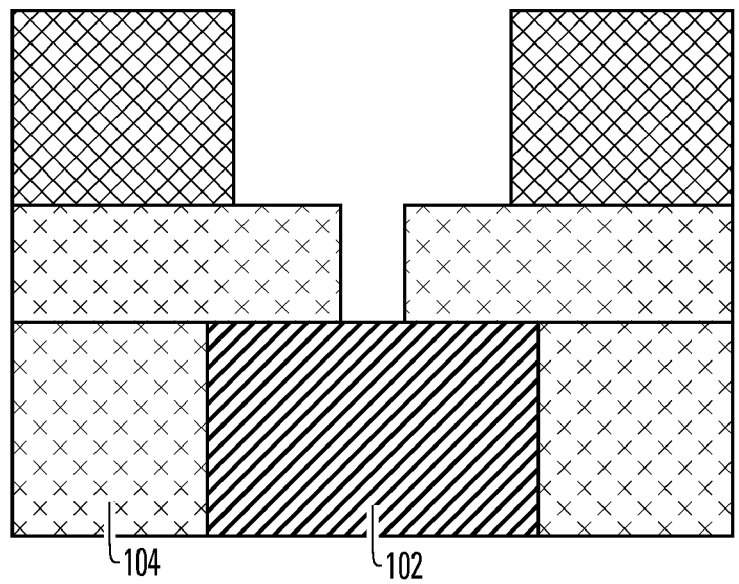

Next the sidewall spacer 800 is removed from the structure illustrated in FIG. 9, resulting in the structure illustrated in FIG. 10. The sidewall spacer 800 in embodiments comprising silicon can be removed, for example, by using KOH or TMAH.

Figure 11:
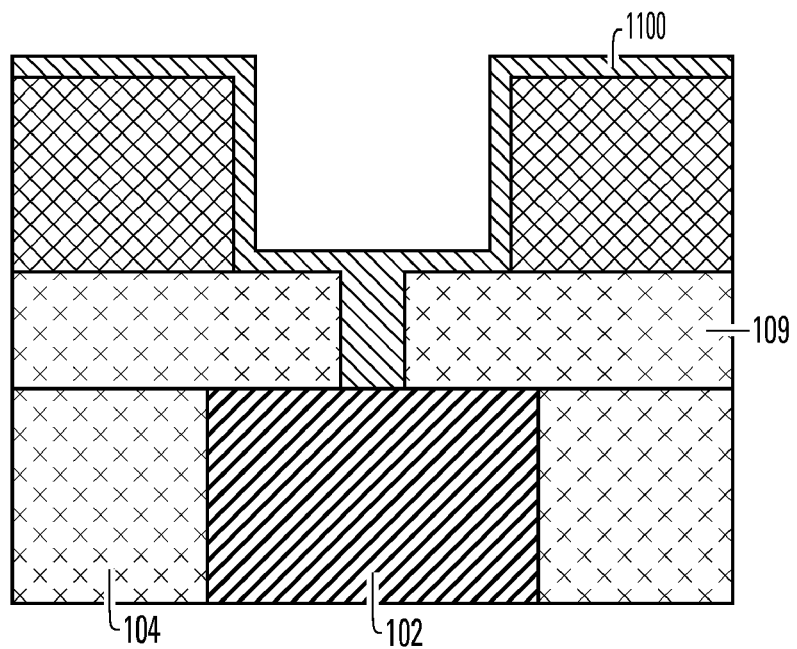

Next a conformal layer of electrode element material 1100 is formed on the structure illustrated in FIG. 10, resulting in the structure illustrated in FIG. 11. The layer of electrode element material 1100 can be formed, for example, by Chemical Vapor Deposition CVD. Then the structure illustrated in FIG. 11 is planarized using, for example, Chemical Mechanical Polishing CMP, resulting in the structure illustrated in FIG. 12 having an electrode element 106 with a critical dimension 1200.

The critical dimension 1200 of the electrode element 106 is controllable by the sizes and aspect ratio of the via (see FIG. 5, ref. num. 500) and enlarged via (see FIG. 6, ref. num. 600), the overhang portions of the cap layer (see FIG. 6, ref. num. 610), and the etch conditions and techniques used to define the sidewall spacer (see FIG. 8, reference number 800) and void (see FIG. 9, ref. num. 900).

Advantages of using the process illustrated in FIGS. 4-12 include producing very uniform memory cells across a wafer containing many memory cells. Additionally, the contact area of the memory material layer 108 with the electrode elements 106 can be very small. Memory arrays made according to embodiments of the invention are more uniform and have lower power requirements.

Figure 12:
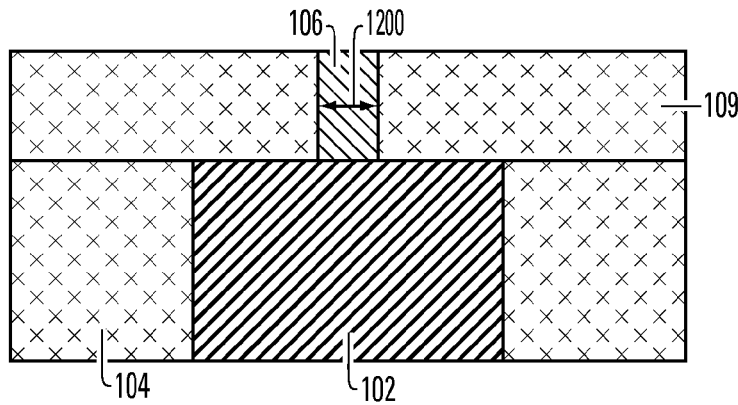
Figure 13:
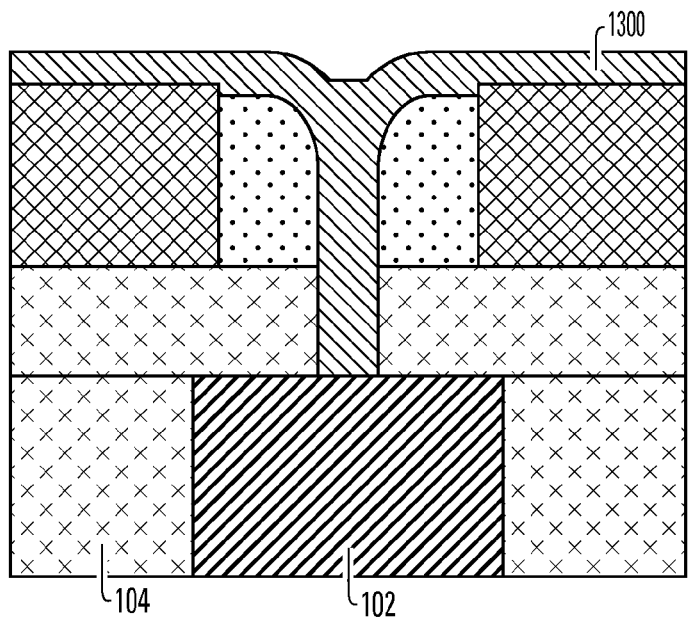
FIGS. 13-14 illustrate an alternative embodiment to FIGS. 10-12 of a process of fabricating the electrode element.
Figure 14:
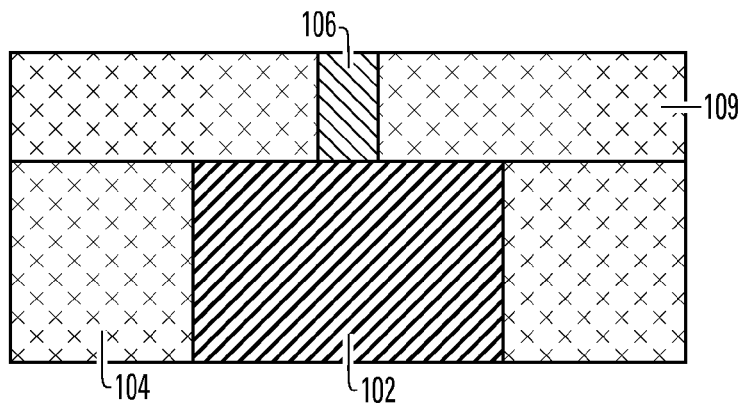

FIGS. 13-14 illustrate an alternative embodiment of a manufacturing method to that illustrated in FIGS. 10-12. FIG. 13 illustrates forming a layer of electrode element material 1300 on the structure illustrated in FIG. 9. Then the structure illustrated 13 is planarized using for example CMP, resulting in the structure illustrated in FIG. 14 having an electrode element 106.

It should be understood that the embodiments set out above are exemplary in nature and do not constitute the entire range of devices that can be fabricated within he spirit of the claims herein. Those claims, appended hereto, are the sole measure of the scope of the invention, and a number of variations on the structures set out herein can be accomplished without departing from the scope of the present invention.

What is claimed is:

1. A memory device, comprising: an electrode element; a phase change layer, formed from a memory material having at least two solid phases, positioned in electrical contact with the electrode element; and a top electrode element, making electrical contact with the phase change layer at a location remote from the contact location of the electrical contact between the phase change layer and the electrode element, thereby defining a current flow path through the phase change layer wherein at least a portion thereof lies in a path transverse to the current flow path within the electrode element, further comprising a block element having a perimeter, formed of an insulating material, lying on the opposite side of the phase change layer from the electrode element, and having a lateral extent in the direction of the phase change layer greater than that of the electrode element.

2. The device of claim 1, wherein the phase change layer has a thickness in a range of 2-20 nm thick.

3. The device of claim 1, wherein the electrode element contacts an access circuit.

4. The device of claim 1, wherein the memory material comprises an alloy including a combination of two or more materials from the group of Ge, Sb, Te, Se, In, Ti, Ga, Bi, Sn, Cu, Pd, Pb, Ag, S, and Au, the alloy being doped using one of more of nitrogen, silicon, oxygen, silicon dioxide, silicon nitride, copper, silver, gold, aluminum, aluminum oxide, tantalum, tantalum oxide, tantalum nitride, titanium and titanium oxide.

5. The device of claim 1, further comprising a bit line overlying the block element and the phase change layer, wherein the top electrode element is a portion of the bit line in contact with the phase change layer near the perimeter of the block element.

6. The device of claim 3, wherein the electrode element comprises Ti and N.

7. The device of claim 1, further comprising a block element, formed of an insulating material, lying on the opposite side of the phase change layer from the electrode element, and having a lateral extent in the direction of the phase change layer greater than that of the electrode element.

8. A memory device, comprising:
an electrode element;
a phase change layer, formed from a memory material having at least two solid phases, positioned in electrical contact with a top surface of the electrode element, wherein the phase change layer has a thickness in a range of 2-20 nm, and
a top electrode element, making electrical contact with the phase change layer at a location remote from the electrical contact with the top surface of the electrode element; and
a block element, formed of an insulating material, lying on the opposite side of the phase change layer from the electrode element, and having a lateral extent in the direction of the phase change layer greater than that of the top surface of the electrode element,
wherein at least a portion of the current flow through the phase change element lies in a path transverse to the current flow path within the electrode element.

9. The device of claim 8, wherein the electrode element contacts an access circuit.

10. The device of claim 8, wherein the memory material comprises an alloy including a combination of two or more materials from the group of Ge, Sb, Te, Se, In, Ti, Ga, Bi, Sn, Cu, Pd, Pb, Ag, S, and Au, the alloy being doped using one of more of nitrogen, silicon, oxygen, silicon dioxide, silicon nitride, copper, silver, gold, aluminum, aluminum oxide, tantalum, tantalum oxide, tantalum nitride, titanium and titanium oxide.

11. The device of claim 8, further comprising a bit line overlying the block element and the phase change layer, wherein the top electrode element is a portion of the bit line in contact with the phase change layer near the perimeter of the block element.

12. The device of claim 9, wherein the electrode element comprises Ti and N.

13. A method for forming a memory device, comprising:
forming an electrode element, generally elongated in form and having a contact surface;
forming a phase change layer, generally planar in form, in electrical contact with the contact surface of the electrode element and having a thickness in a range of 2-20 nm, and a lateral extent greater than that of the electrode element;
depositing a block element having a perimeter, formed of an insulating material, on the opposite side of the phase change layer from the contact surface of the electrode element, and having a lateral extent in the direction of the phase change layer greater than that of the contact surface of the electrode element; and
providing an output electrical contact on a side of the phase change layer near the perimeter of the block element.

14. The method of claim 13, including forming a bit line over the block element, and in contact with the side of the phase change layer, wherein the output electrical contact is a portion of the bit line contacting the side of the phase change layer near the perimeter of the block element.

15. The method of claim 13, wherein the memory material comprises an alloy including a combination of two or more materials from the group of Ge, Sb, Te, Se, In, Ti, Ga, Bi, Sn, Cu, Pd, Pb, Ag, S, and Au, the alloy being doped using one of more of nitrogen, silicon, oxygen, silicon dioxide, silicon nitride, copper, silver, gold, aluminum, aluminum oxide, tantalum, tantalum oxide, tantalum nitride, titanium and titanium oxide.

16. The method of claim 13, wherein the forming an electrode element step further includes forming a pillar electrode on a contact coupled to an access circuit element.

17. The method of claim 13, wherein the electrode element comprises Ti and N.

18. A memory array, comprising:
a plurality of word lines arranged along rows in the array;
access circuits coupled to the plurality of word lines for coupling a reference voltage to electrode contacts in respective rows;
a plurality of electrode elements electrically connected to respective electrode contacts in the access circuits, the electrode elements having respective top surfaces;
a plurality of lines of memory material, the lines of memory material contacting the top surfaces of electrode elements in respective columns of the array, the memory material having a thickness and having at least two solid phases;
an array of insulating block elements on the lines of memory material, each block element having an area larger than that of the top surfaces of the electrode elements and overlying a corresponding electrode element top surface on an opposite side of the line of memory material; and
a plurality of conductive bit lines overlying the plurality of lines of memory material and the array of block elements and contacting the corresponding lines of memory material on perimeters of the block elements, thereby defining current flow paths between bit lines and the electrode elements through the memory material, the current flow paths having a path length determined by a distance from the top surface of the electrode elements to the perimeter of the block elements where the bit lines contact the lines of memory material and which is greater than the thickness of the line of memory material.

19. The memory array of claim 18, wherein the electrode elements have a pillar-shape.

20. The memory array of claim 18, wherein the block elements comprise a first dielectric layer on the lines of memory material, and a second dielectric layer on the first dielectric layer.

21. The memory array of claim 18, wherein the bit lines have sides aligned with those of the corresponding lines of memory material.

* * * * *